(12) United States Patent
Tu et al.

(10) Patent No.: US 7,960,784 B2
(45) Date of Patent: Jun. 14, 2011

(54) SEMICONDUCTOR STRUCTURE AND FABRICATION METHOD THEREOF

(75) Inventors: Kao-Way Tu, Taipei County (TW); Cheng-Hui Tung, Taipei County (TW)

(73) Assignee: Nicko Semiconductor Co., Ltd., Taipei County (TW)

( * ) Notice: Subject to any disclaimer, the term of this patent is extended or adjusted under 35 U.S.C. 154(b) by 0 days.

(21) Appl. No.: 12/901,243

(22) Filed: Oct. 8, 2010

(65) Prior Publication Data

US 2011/0037122 A1 Feb. 17, 2011

Related U.S. Application Data

(62) Division of application No. 12/403,660, filed on Mar. 13, 2009, now Pat. No. 7,838,343.

(30) Foreign Application Priority Data

Jul. 29, 2008 (TW) ................................ 97128695 A (51) Int. Cl.
*H01L 29/66* (2006.01)

(52) U.S. Cl. .......................... 257/334; 257/331; 438/270
(58) Field of Classification Search .................. 257/334, 257/210, 331, 342, 371, 409, 500; 438/197, 438/216
See application file for complete search history.

(56) References Cited

U.S. PATENT DOCUMENTS

2009/0014787 A1 * 1/2009 Wang ............................ 257/331
* cited by examiner

*Primary Examiner* — Thanh V Pham
*Assistant Examiner* — Errol Fernandes
(74) *Attorney, Agent, or Firm* — Schmeiser, Olsen & Watts LLP (57) ABSTRACT

A semiconductor fabrication process according to the present invention defines an auxiliary structure with a plurality of spaces with a predetermined line-width in the oxide layer to prevent the conductive material in the spaces from being removed by etching or defined an auxiliary structure to rise the conductive structure so as to have the conductive structure being exposed by chemical mechanical polishing. Thus, the transmitting circuit can be defined without requiring an additional mask. Hence, the semiconductor fabrication process can reduce the number of required masks to lower the cost.

9 Claims, 14 Drawing Sheets

SEMICONDUCTOR STRUCTURE AND FABRICATION METHOD THEREOF

CROSS REFERENCE TO RELATED APPLICATION(S)

This application is a division of and claims priority to U.S. patent application to Koa-Way Tu, et al. entitled "SEMICONDUCTOR STRUCTURE AND FABRICATION METHOD THEREOF," Ser. No. 12/403,660, filed Mar. 13, 2009, which claims priority under 35 U.S.C. §119 to Taiwan Patent Application No. 097128695, filed Jul. 29, 2008, the disclosures of which are hereby incorporated entirely herein by reference.

FIELD OF THE INVENTION

The present invention relates to a semiconductor structure and a fabrication method thereof, and more particularly to a double-diffused metal oxide semiconductor (DMOS) structure having a guard ring and a fabrication method thereof.

BACKGROUND OF THE INVENTION

As the function of present integrated circuits becomes more powerful and the structure of the integrated circuits becomes more complicated, the number of masks needed for fabricating the integrated circuits increases accordingly, and thus incurs a higher fabrication cost.

Figure 1A:
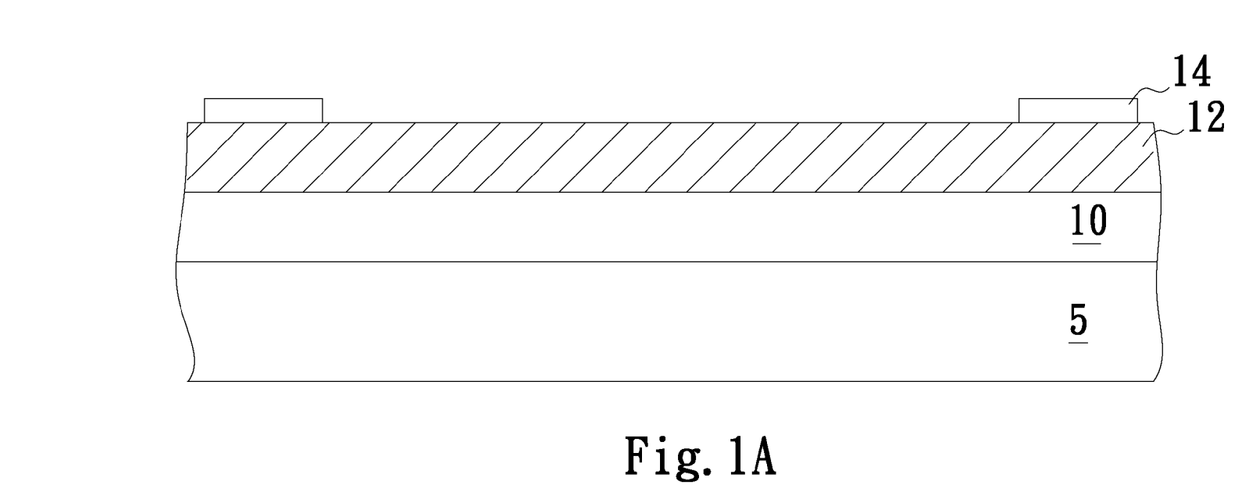
FIGS. 1A to 1I show a fabrication process of a conventional N-type double-diffused metal oxide semiconductor (DMOS) structure.
Figure 1B:
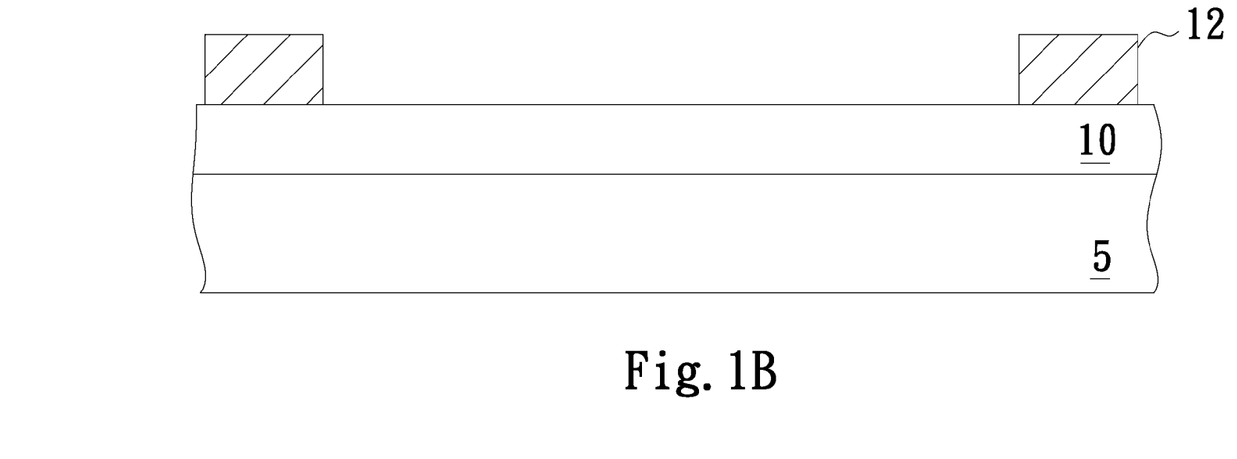
Figure 1C:
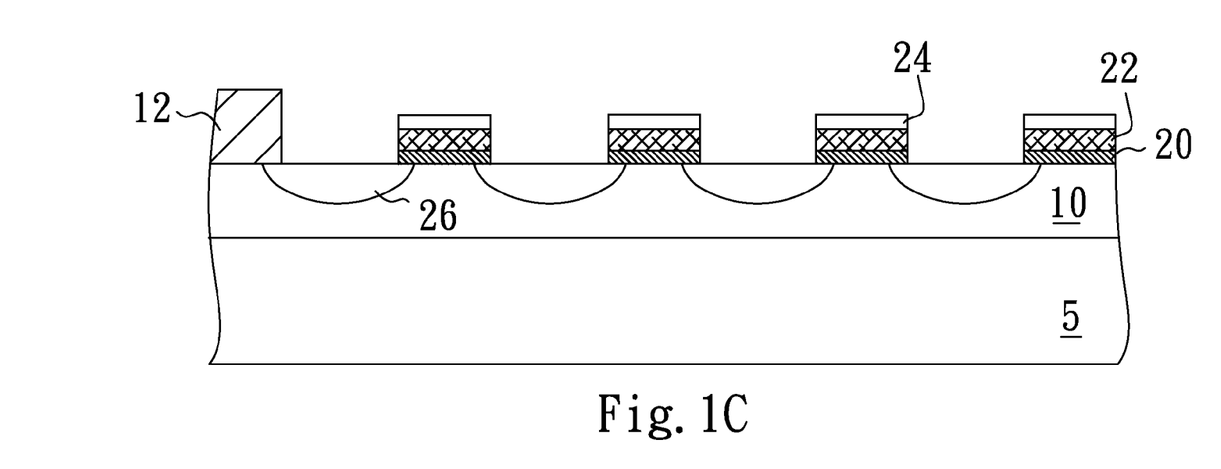
Figure 1D:
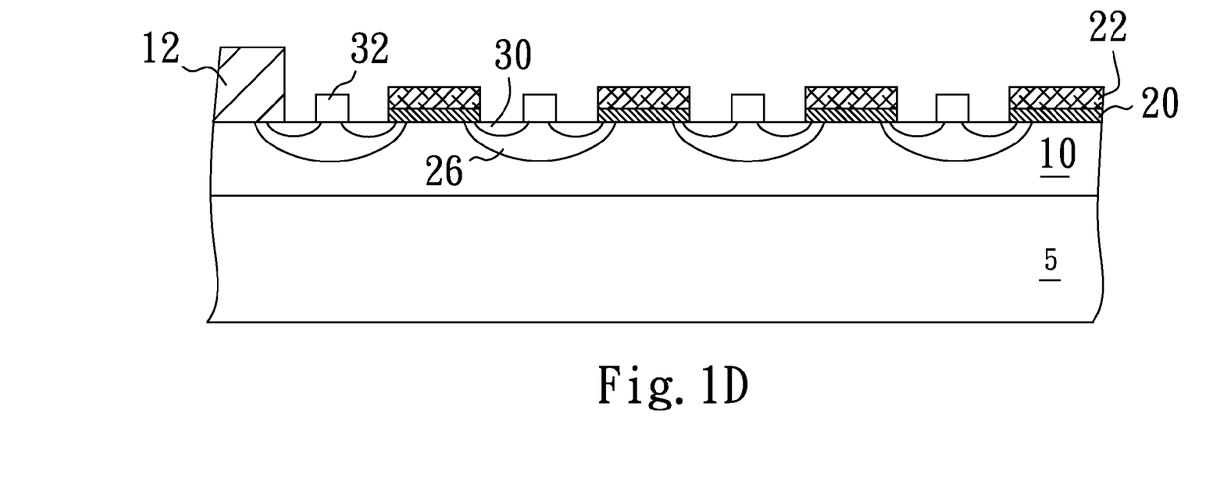
Figure 1E:
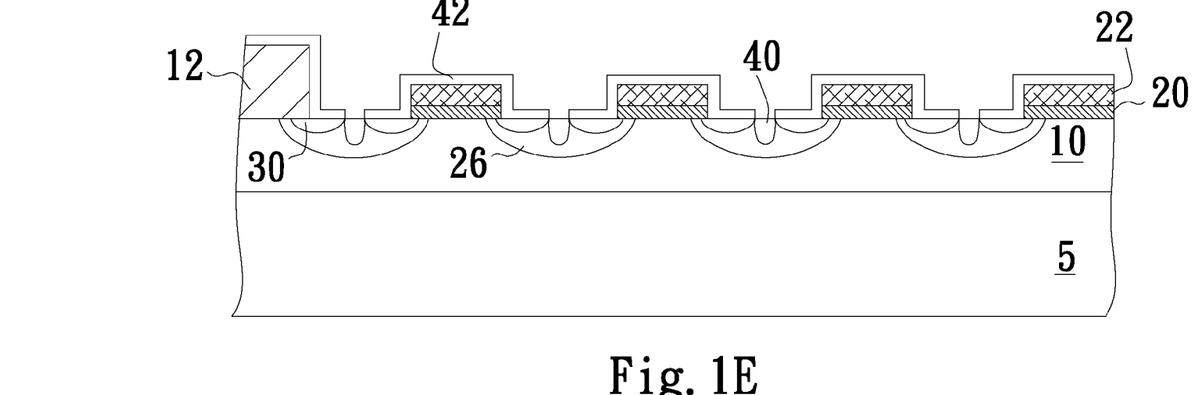

With reference to FIGS. 1A to 1I for a fabrication process of an N-type double-diffused metal oxide semiconductor (DMOS) structure, an N-epitaxial layer 10 and a field oxide layer 12 are grown sequentially on a silicon substrate 5 as shown in FIG. 1A, and a first mask is used for forming a first photoresist layer 14 to define a region for locating a guard ring. In FIG. 1B, the exposed field oxide layer 12 is removed by etching through the first photoresist layer 14, and then the first photoresist layer 14 is removed. The remained field oxide layer 12, which is corresponding to the location of the guard ring, defines active regions of the metal oxide semiconductor power transistors. To clearly describe the fabrication process of the N-type double-diffused metal oxide semiconductor (DMOS) structure, only a portion of the guard ring is shown in FIGS. 1C to 1H. Referring to FIG. 1C, after forming a gate oxide layer 20 and a gate electrode layer 22 sequentially on the active regions, a second mask is used to form a second photoresist layer 24 for defining gate electrodes of the DMOS cells. The exposed gate electrode layer 22 and the gate oxide layer 20 are then removed by etching so as to expose a portion of the N-epitaxial layer 10. Afterward, an ion implantation process is used for implanting P-type impurities to the exposed portion of the N-epitaxial layer 10, and a high temperature thermal process is followed to drive in the P-type impurities to form a P-well region 26. Afterward, with reference to FIG. 1D, the second photoresist layer 24 is removed, and a third mask is used for forming a third photoresist layer 32 to define source regions of the DMOS cells. Then, an ion implantation process is used for implanting N-type impurities and a high temperature thermal process is followed to drive in the N-type impurities to form N+ source regions 30. In FIG. 1E, after the third photoresist layer 32 is removed, a fourth mask is used for forming a fourth photoresist layer 42 to define a P-type heavily doped region 40. Then, an ion implantation process is used for implanting P-type impurities in the P-type heavily doped region 40.

Figure 1F:
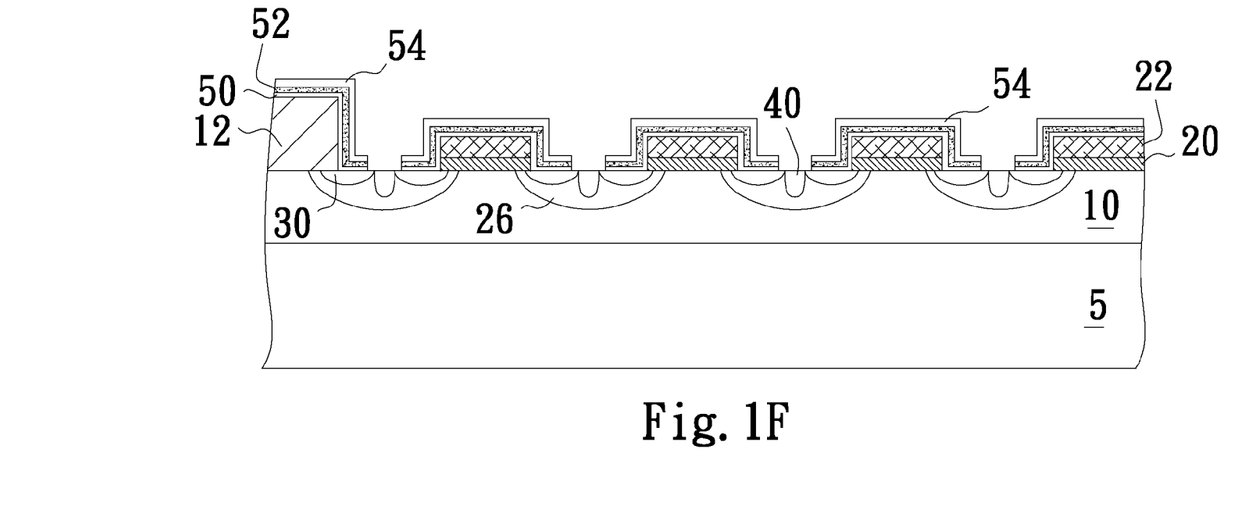
Figure 1G:
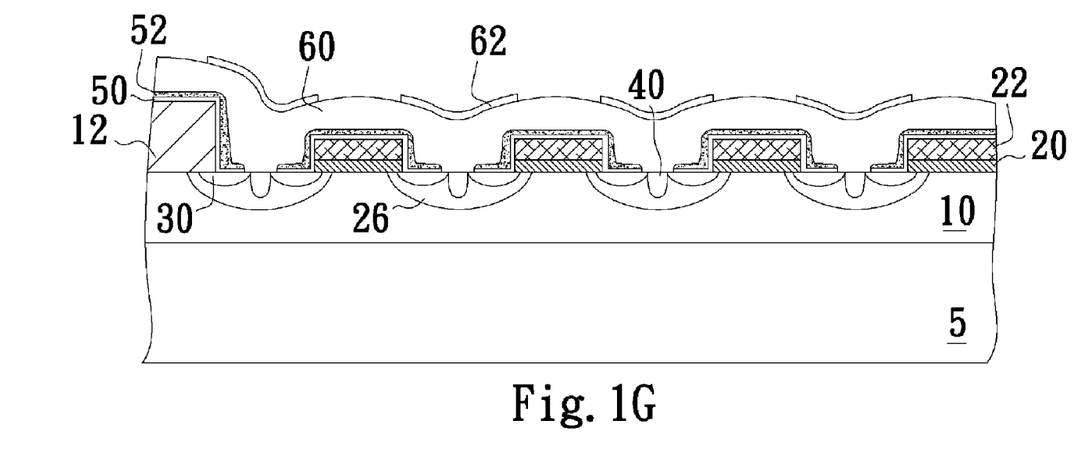
Figure 1H:
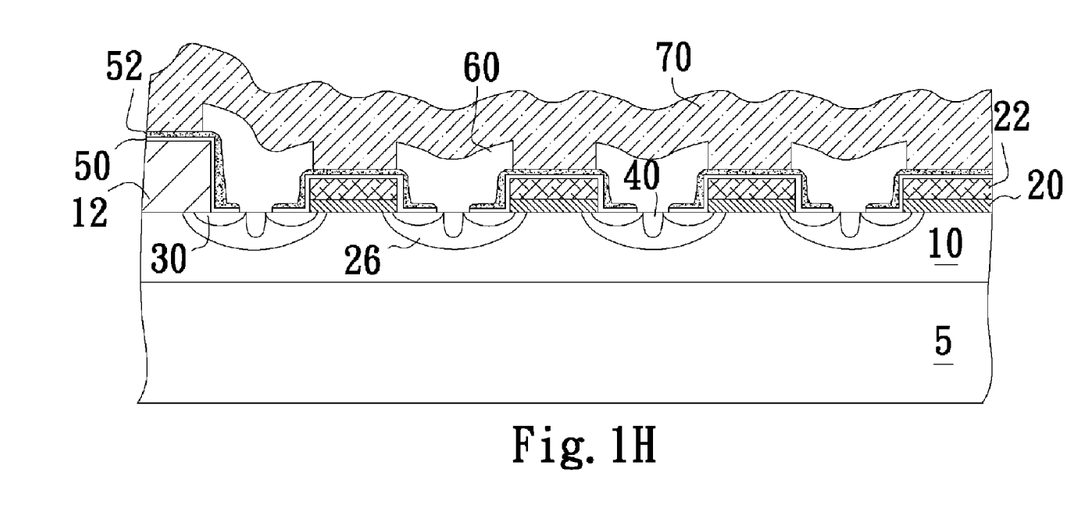
Figure 1I:
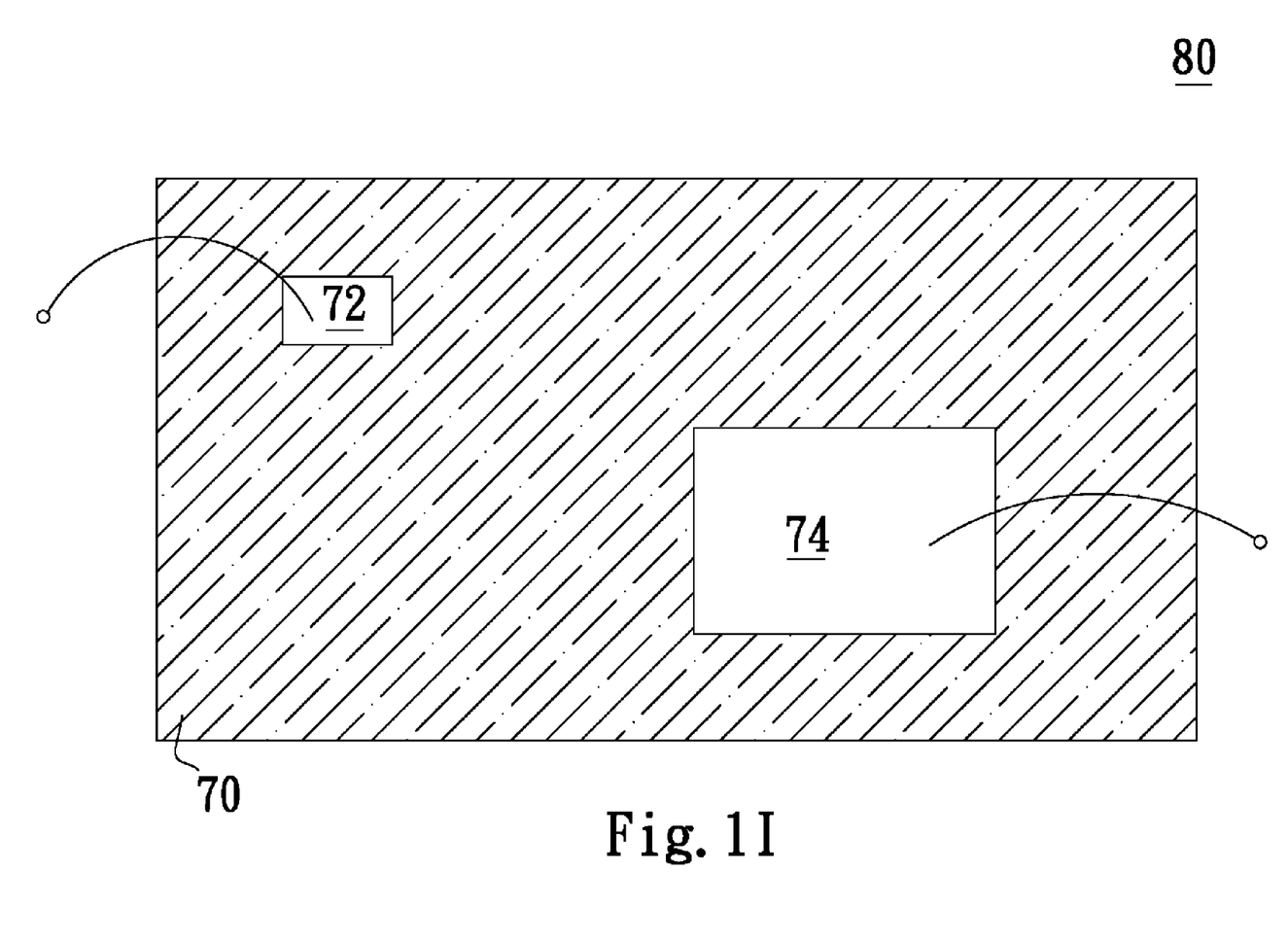

Thereafter, referring to FIG. 1F, a silicon oxide layer 50 and a boron-phosphorus-silicon-glass (BPSG) layer 52 are formed sequentially, and a fifth mask is used for forming a fifth photoresist layer 54 to define a contact window region. The silicon oxide layer 50 and the boron-phosphorus-silicon-glass (BPSG) layer 52 with respect to the contact window region are then etched and removed to expose the P-type heavily doped region 40. Afterward, a high temperature thermal process is carried out to reflow the BPSG layer 52. Then, in FIG. 1G, a metal layer 60 is deposited over all the exposed surfaces, and a sixth mask is used for forming a sixth photoresist layer 62 to define a signal transmitting circuit. In FIGS. 1H and 1I, after the signal transmitting circuit is formed by etching, a passivation layer 70 is formed for protecting the N-type double-diffused metal oxide semiconductor (DMOS) cells 80, and then a seventh mask is used for defining a gate pad region 72 and a source pad region 74 for wire bonding.

In the fabrication method of the aforementioned N-type double-diffused metal oxide semiconductor (DMOS) structure, seven masks are used and the cost of masks is very high. Thus, it is eager for manufacturers in the industry to develop a process to simplify the lithographic steps with respect to different masks to reduce the number of masks needed in the fabrication process so as to reduce the fabrication cost.

SUMMARY OF THE INVENTION

Therefore, it is a primary objective of the present invention to overcome the drawbacks of the prior art by reducing the number of masks needed for the semiconductor fabrication process. The present invention provides a semiconductor fabrication process which defines a plurality of separated spaces by using the oxide layer which is solely for defining the active regions in prior art. These spaces defined by the oxide layer are utilized for locating the transmitting circuit. Thus, the mask solely for defining the location of the transmitting circuit in prior art can be skipped so as to reduce the cost of mask.

To achieve the foregoing objective, the present invention provides a semiconductor structure comprising a substrate, a plurality of operating units, a non-conductive auxiliary structure, a conductive layer, a dielectric layer, and a contact portion. The substrate has an operating region and a transmitting region. The operating units are located in the operating region for receiving a control signal and are operated according to the control signal. The non-conductive auxiliary structure is located in the transmitting region and has a plurality of spaces with a predetermined line-width formed therein. The conductive layer has a transmitting portion located in the spaces for electrically connecting to the operating units. The dielectric layer is located on the conductive layer. A contact window is formed in the conductive layer and the dielectric layer to expose the auxiliary structure and the transmitting portion. The contact portion is formed in the contact window and connected to the transmitting portion for receiving the control signal.

The present invention also provides a double-diffused metal oxide semiconductor (DMOS) structure comprising a substrate, a plurality of DMOS cells, a non-conductive auxiliary structure, a conductive layer, a dielectric layer, and a contact portion. The substrate has an operating region and a transmitting region. The DMOS cells are located in the operating region. Each of the DMOS cells has a gate electrically coupled to the transmitting region, and is operated according to a gate control signal. The non-conductive auxiliary structure is located in the transmitting region and has a plurality of spaces with a predetermined line-width formed therein. The conductive layer has a transmitting portion located in the spaces for electrically connecting to the DMOS cells. The dielectric layer is located on the conductive layer. A contact window is formed in the conductive layer and the dielectric layer to expose the auxiliary structure and the transmitting portion. The contact portion is formed in the contact window and connected to the transmitting portion for receiving the gate control signal.

The present invention further provides a metal oxide semiconductor power transistor fabrication process comprising the steps of: (a) forming a field oxide layer on a substrate; (b) defining a guard portion and an auxiliary structure in the field oxide layer by using a first mask, wherein the auxiliary structure having a plurality of spaces with a predetermined linewidth being defined therein; (c) forming a gate oxide layer on the substrate; (d) forming a gate electrode layer on the gate oxide layer and covering the auxiliary structure; (e) forming a dielectric layer on the gate electrode layer; (f) defining a gate electrode and a contact window by using a second mask, wherein the contact window is located above the auxiliary structure; (g) removing the gate electrode layer and the dielectric layer through the second mask by etching, wherein a portion of the gate electrode layer is remained in the spaces defined in the auxiliary structure; (h) forming a plurality of well regions and a plurality of source/drain regions in the substrate; (i) forming a metal layer on the source/drain regions and the contact window; and (j) removing a portion of the metal layer to form a source/drain pad and a gate pad by using a third mask.

The present invention further provides a semiconductor structure comprising a substrate, a plurality of operating units, a non-conductive auxiliary structure, a conductive layer, a dielectric layer, and a contact portion. The substrate has an operating region and a transmitting region. The operating units are located in the operating region for receiving a control signal, and are operated according to the control signal. The non-conductive auxiliary structure is located in the transmitting region. The conductive layer has a transmitting portion. The transmitting portion is stacked on the auxiliary structure for electrically connecting to the operating units. The dielectric layer is located on the substrate. A protruding portion of the dielectric layer located above the transmitting portion is removed by chemical mechanical polishing (CMP) to expose the transmitting portion. The contact portion is formed on the exposed transmitting portion for receiving the control signal.

The present invention further provides a double-diffused metal oxide semiconductor (DMOS) structure comprising a substrate, a plurality of DMOS cells, a nonconductive auxiliary structure, a conductive layer, a dielectric layer, and a contact portion. The substrate has an operating region and a transmitting region. The DMOS cells are located in the operating region. Each of the DMOS cells has a gate electrically coupled to the transmitting region, and is operated according to a gate control signal. The non-conductive auxiliary structure is located in the transmitting region and protruding from an upper surface of the substrate. The conductive layer has a transmitting portion stacked on the auxiliary structure for electrically connecting to the DMOS cells. The dielectric layer is located on the substrate. A protruding portion of the dielectric layer located above the transmitting portion is removed by chemical mechanical polishing (CMP) to expose the transmitting portion. The contact portion is formed on the exposed transmitting portion for receiving the control signal.

The present invention further provides a metal oxide semiconductor power transistor fabrication method comprising the steps of: (a) forming a field oxide layer on a semiconductor substrate; (b) defining a guard portion and an auxiliary structure in the field oxide layer by using a first mask; (c) forming a gate oxide layer on the substrate; (d) forming a gate electrode layer on the gate oxide layer and covering the auxiliary structure; (e) forming a dielectric layer on the gate electrode layer, wherein the dielectric layer has a protruding portion located above the auxiliary structure; (f) defining a gate electrode and a transmitting region by using a second mask, wherein the transmitting portion is corresponding to the auxiliary structure; (g) removing the gate electrode layer and the dielectric layer through the second mask by etching; (h) forming a plurality of well regions and a plurality of source/drain regions in the substrate; (i) removing the protruding portion of the dielectric layer right above the auxiliary structure by chemical mechanical polishing (CMP) so as to expose the gate electrode layer in the transmitting region; (j) forming a metal layer on the source/drain regions and the exposed gate electrode layer; and (k) removing a portion of the metal layer to form a source/drain pad and a gate pad by using a third mask.

The general description above and the detailed description below are provided for the illustration purpose. Other features and advantages of the present invention will become apparent in the following detailed description of the preferred embodiments with reference to the accompanying drawings.

DESCRIPTION OF THE PREFERRED EMBODIMENT

The main feature of the present invention resides on the fabrication step of forming a non-conductive layer, such as a field oxide layer or an ordinary silicon oxide layer, in the semiconductor fabrication process, which forms a non-conductive auxiliary structure in a transmitting region for locating the transmitting circuit. There may be a gate bus line and/or a data line formed on the transmitting region for transmitting a control signal or a data signal electrically coupled to each of the operating units in an operating region (or transistor region) of an integrated circuit to have the operating units operated according to the control signal. The non-conductive auxiliary structure partitions a plurality of spaces therein. The conductive layer formed on the non-conductive auxiliary structure fills the spaces such that even the conductive layer on the non-conductive auxiliary structure is removed by etching, some conductive material still remains in the spaces. The remained conductive material in the spaces would be utilized for transmitting signals. Finally, a conductive structure serving as a contact portion of the semiconductor structure is formed in the contact window connected to the remained conductive material in the spaces for transmitting the received control signal to each operating unit. Therefore, the circuits for transmitting the control signal can be defined without using an additional mask.

An N-type double-diffused metal oxide semiconductor (DMOS) structure is taken as an example for the illustration.

Figure 2A:
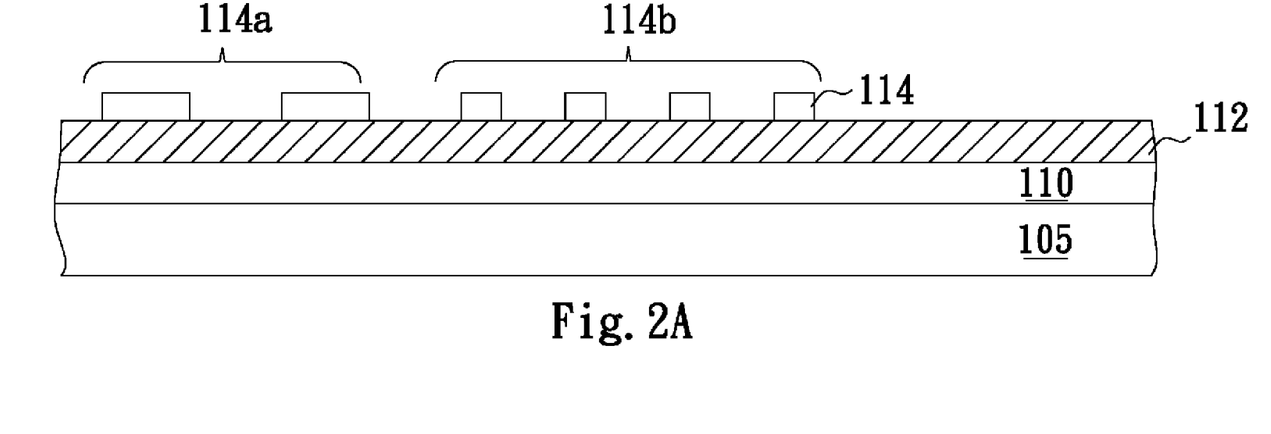
FIGS. 2A to 2H show a fabrication process of an N-type double-diffused metal oxide semiconductor (DMOS) structure in accordance with a first preferred embodiment of the present invention.
Figure 2B:
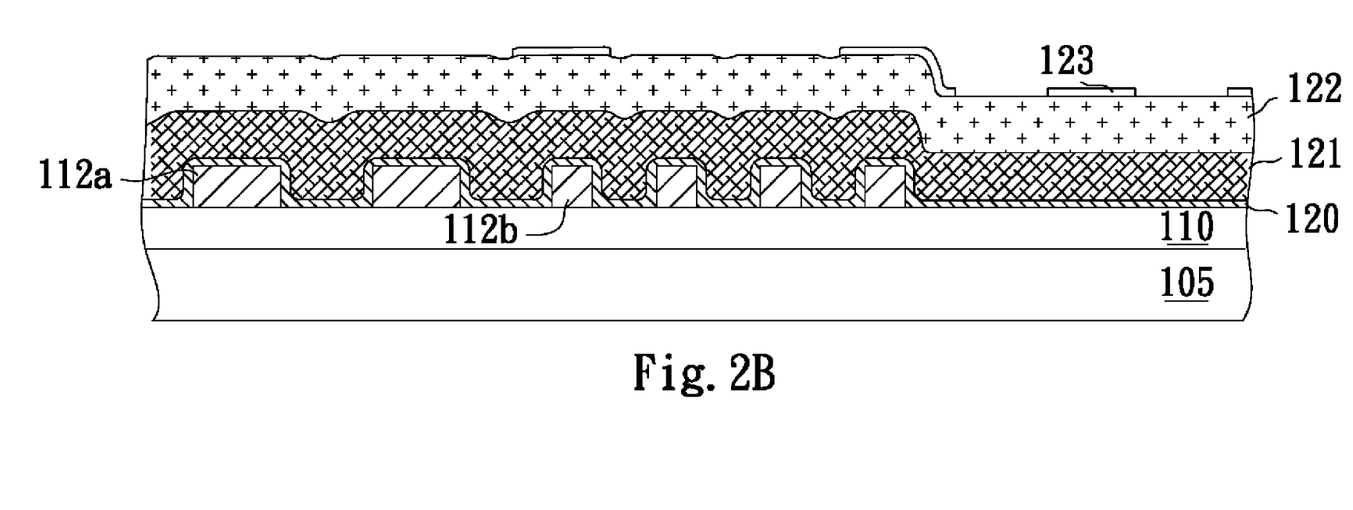

In FIG. 2A, an N-epitaxial layer 110 and a field oxide layer 112 are formed sequentially on a silicon substrate 105 (wherein the silicon substrate 105 together with the N-epitaxial layer 110 is called a semiconductor substrate), and a first mask is used for forming a first photoresist layer 114 to define the location of a guard ring 114a and a transmitting region 114b. Afterward, the exposed field oxide layer 112 is etched, through the first photoresist layer 114 so as to form a guard portion 112a with respect to the guard ring 114a and an auxiliary structure 112b with respect to the transmitting region 114b. Then, the first photoresist layer 114 is removed. Afterward, in FIG. 2B, a gate oxide layer 120, a gate electrode layer 121, and a dielectric layer 122 are formed sequentially, and a second mask is used for forming a second photoresist layer 123 to define a contact window region 128 and a gate region with respect to a plurality of transistors in the transistor region (see FIG. 2C), wherein the gate electrode layer 121 may be made of polysilicon, and the dielectric layer 122 may be made of silicon nitride.

Figure 2C:
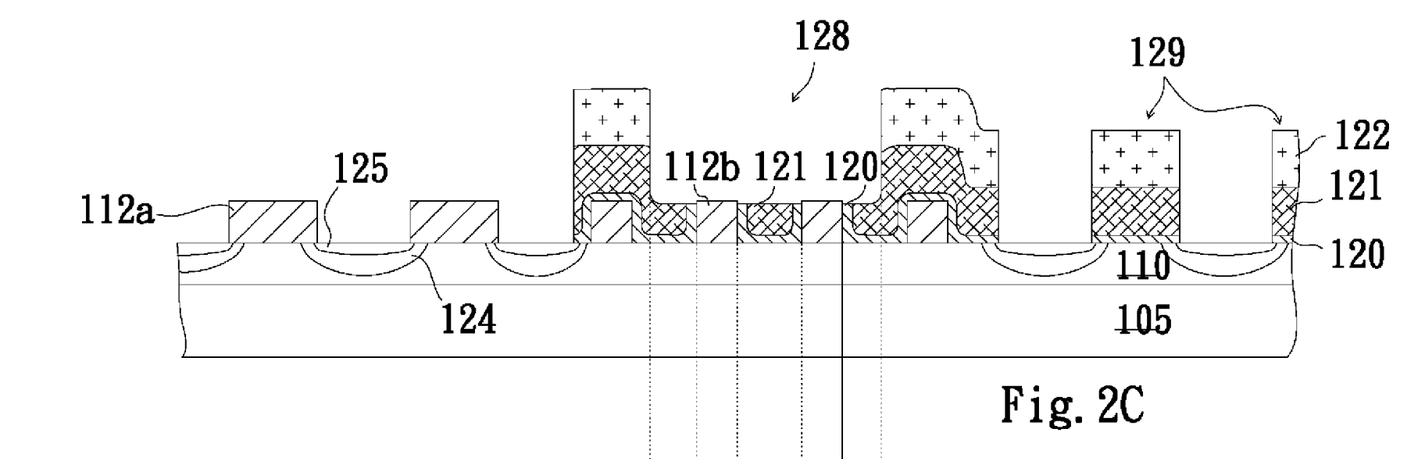
Figure 2D:
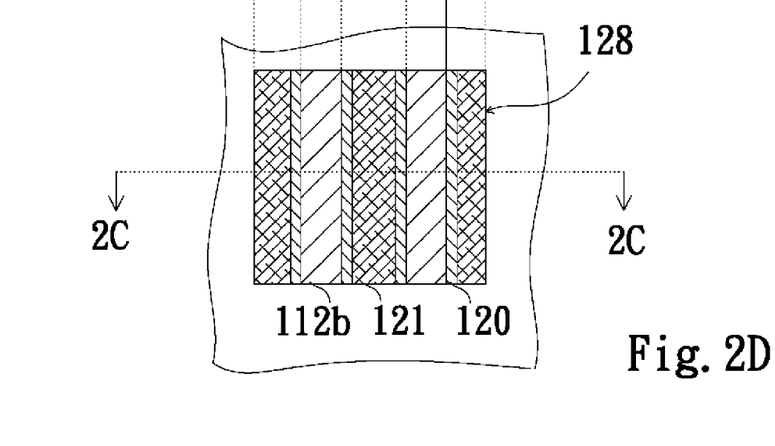

In FIG. 2C, a dry-etching process is carried out through the second photoresist layer 123 to expose the N-epitaxial layer 110, to form a contact window 128, and to form a gate region 129. The gate electrode layer 121 above the spaces enclosed by the auxiliary structure 112b is thicker than the other portions of the gate electrode layer 121. Therefore, if the dry etching process is carried out with the N-epitaxial layer 110 as an etch stop layer, a portion of gate electrode layer 121 would be remained in the spaces enclosed by the auxiliary structure 112b. The remained gate electrode layer 121a in the spaces is connected to the gate electrode 121b for transmitting control signals. Afterward, an ion implantation process is used for implanting first dopants (which are P-type impurities in this embodiment) into an exposed portion of the N-epitaxial layer 110, and a high temperature thermal process is carried out to drive in the implanted dopants to form a P-well region 124. Another ion implantation process is used for implanting high concentration second dopants (which are N-type impurities in this embodiment) and a high temperature thermal process is followed to drive in the second dopants to form N+ source/drain regions 125. It is noted that the contact windows 128 are formed on the transmitting region only, and the number of contact windows 128 depends on the current required to be transmitted by the circuits or other considerations. In general, the number of contact windows 128 is greater than one. FIG. 2D shows a top view corresponding to transmitting region in FIG. 2C, and FIG. 2C is a cross-sectional view corresponding to section 2C-2C in FIG. 2D.

Figure 2E:
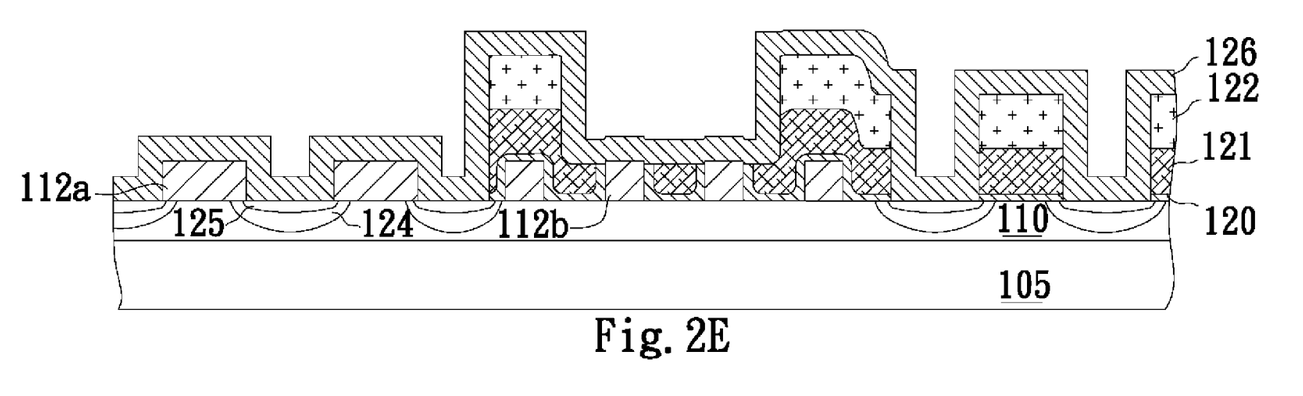
Figure 2F:
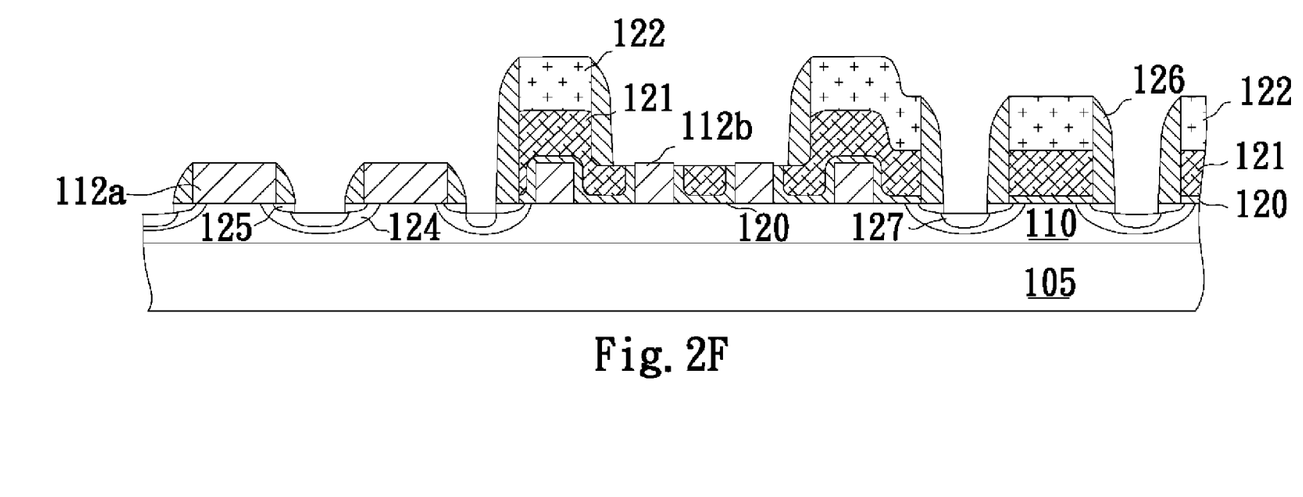

Afterward, in FIG. 2E, a silicon oxide layer 126 is formed over the entire structure. In FIG. 2F, the silicon oxide layer 126 and a portion of the N+ source/drain region 125 are etched by dry etching until the P-well region 124 is exposed. Since the dry etching process is an directional etching process, which has etching speed varies with etching directions, a portion of silicon oxide layer 126 is remained on the sidewalls of the gate electrode 121b, and the exposed surfaces of the remained silicon oxide layer are smooth. Thereafter, an ion implantation process is used for implanting high concentration first dopants (which are P-type impurities in this embodiment) in the exposed P-well region 124 to form a P-type region 127. The thickness of the remained silicon oxide layer on the sidewalls of the gate electrode 121b decides channel length of the N-type double-diffused metal oxide semiconductor (DMOS) cell, and the thickness of remained silicon oxide layer depends on the thickness of the deposited silicon oxide layer 126. Therefore, the present invention may adjust the channel length of the N-type double-diffused metal oxide semiconductor (DMOS) cell by controlling the thickness of the silicon oxide layer 126.

Figure 2G:
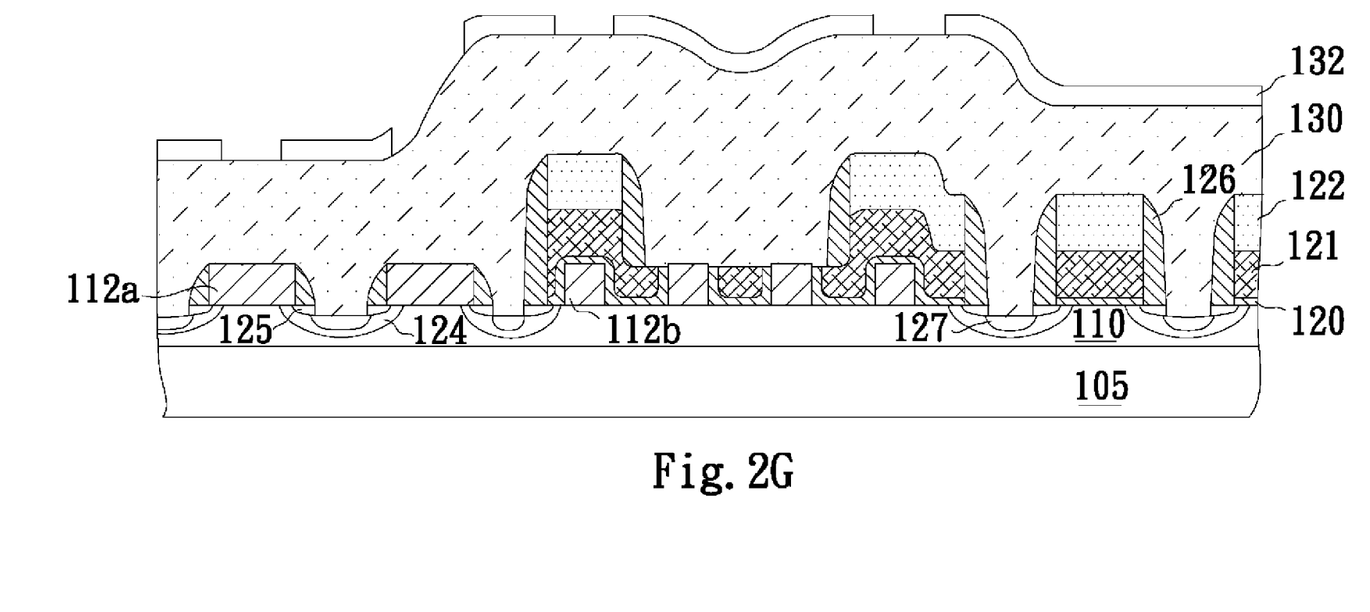
Figure 2H:
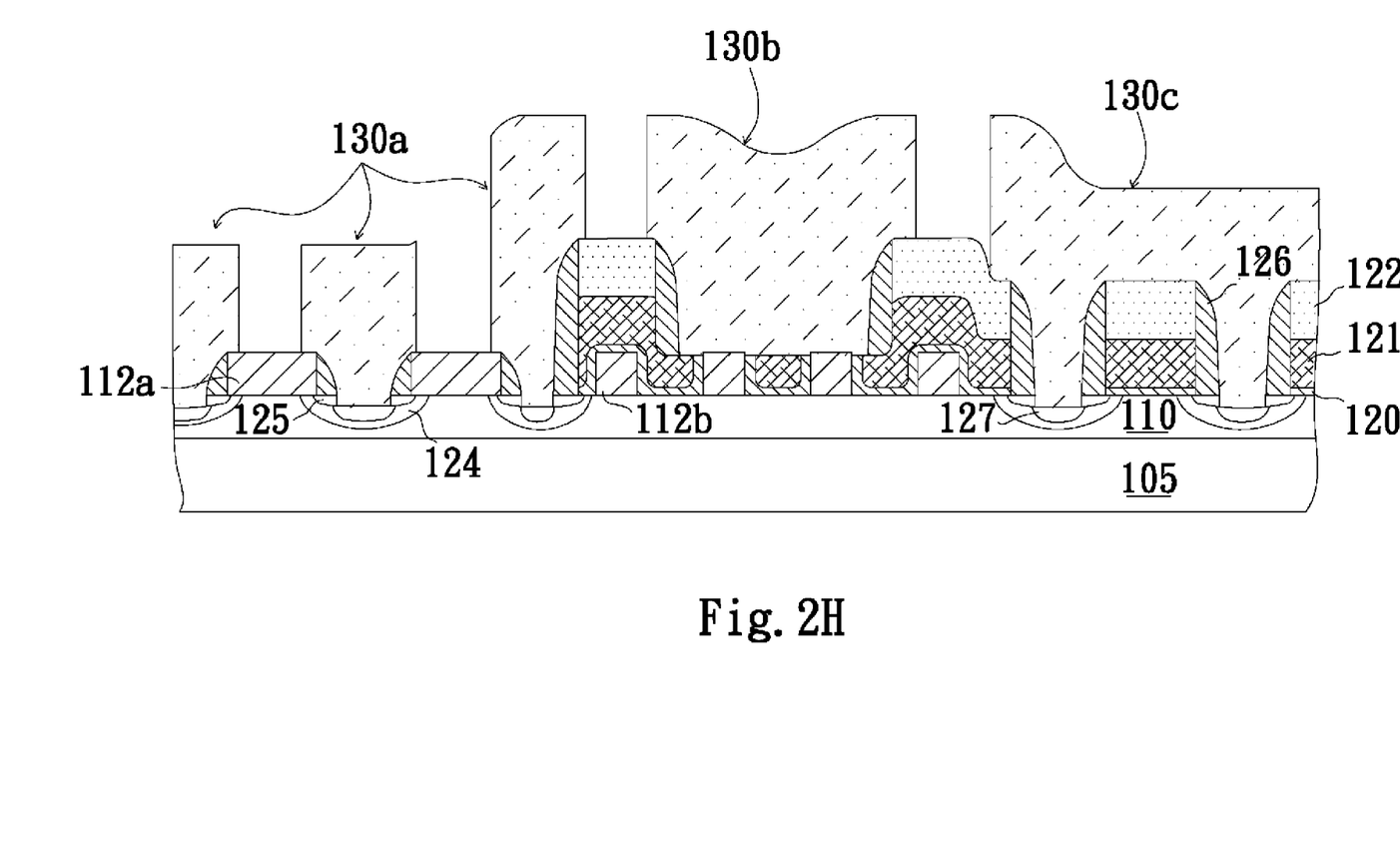

In FIGS. 2G and 2H, a metal layer 130 is formed, and a third mask is used for forming a third photoresist layer 132 to define a source/drain pad 130c, a gate pad 130b, and a guard ring metal 130a in the metal layer 130.

FIGS. 3A to 3G show a fabrication method of an N-type double-diffused metal oxide semiconductor (DMOS) structure in accordance with a second preferred embodiment of the present invention. In contrast with the first preferred embodiment as shown in FIGS. 2A to 2H, the present embodiment forms the contact window on the transmitting region by using the chemical mechanical polishing (CMP).

Figure 3A:
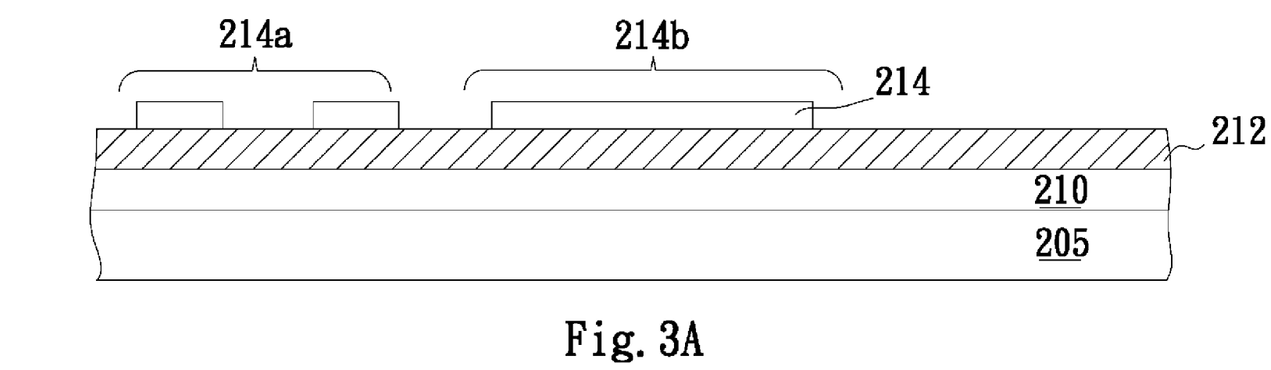
FIGS. 3A to 3G show a fabrication process of an N-type double-diffused metal oxide semiconductor (DMOS) structure in accordance with a second preferred embodiment of the present invention.
Figure 3B:
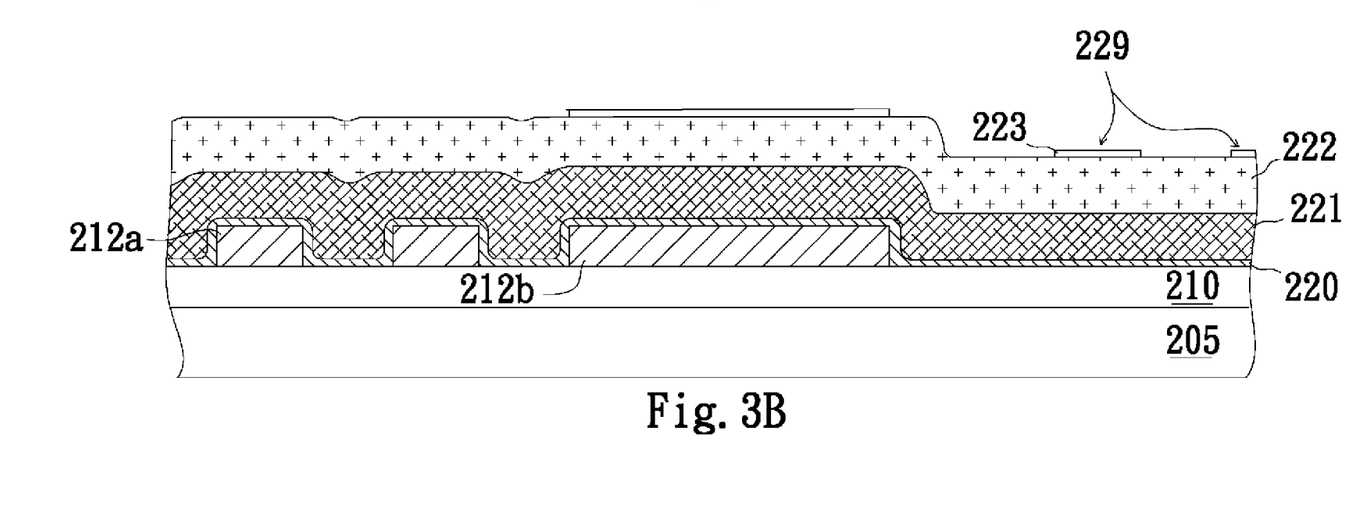

In FIG. 3A, an N-epitaxial layer 210 and a field oxide layer 212 are grown sequentially on a silicon substrate 205 (wherein the silicon substrate 205 together with the N-epitaxial layer 210 is called a semiconductor substrate), and a first mask is used for forming a first photoresist layer 214 to define the location of a guard ring 214a and a transmitting region 214b. Afterward, the exposed field oxide layer is etched through the first photoresist layer 214 so as to form a guard portion 212a of the guard ring 214a and an auxiliary structure 212b of the transmitting region 214b, and then the first photoresist layer 214 is removed. Afterward, in FIG. 3B, a gate oxide layer 220, a gate electrode layer 221, and an dielectric layer 222 are formed sequentially, and a second mask is used for forming a second photoresist layer 223 to define a plurality of gate regions 229 corresponding to the transistors in the transistor region and the transmitting region 214b (see FIG. 3D). The gate electrode layer 221 can be made of polysilicon, and the dielectric layer 222 can be made of silicon nitride.

Figure 3C:
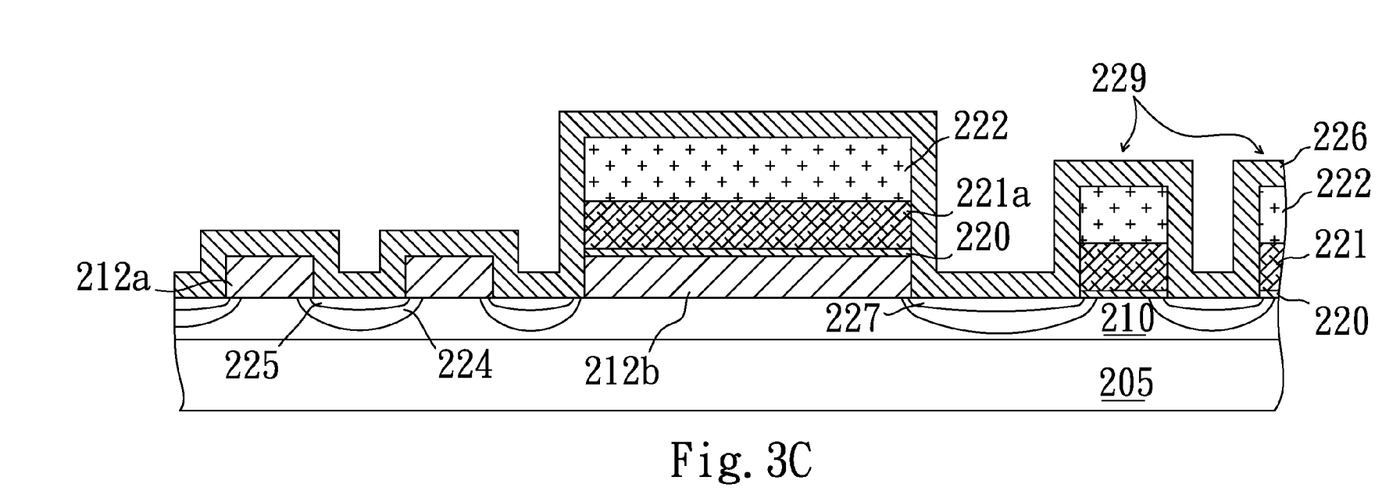

In FIG. 3C, a dry-etching process is carried out through the second photoresist layer 223 to expose the N-epitaxial layer 210, to form the transmitting region 214b and the gate region 229. It is noted that the transmitting portion 221a on the transmitting region 214b is connected to the gate electrode 221b. Because of the existence of the auxiliary structure 212b, the transmitting portion 221a of the transmitting region 214b (which are simultaneously formed with the gate electrode 221b, and the portion of the gate electrode layer 211 corresponding to the transmitting region 214b is called the transmitting portion 221a for facilitating the understanding of the invention) is higher than the gate electrode 221b. An ion implantation process is then used for implanting first dopants (which are P-type impurities in this embodiment) in an exposed portion of the N-epitaxial layer 210, and a high temperature thermal process is carried out to drive in the first dopants to form a P-well region 224. Afterward, the ion implantation process is used for implanting high concentration second dopants (which are N-type impurities in this embodiment) and a high temperature thermal process is carried out to drive in the second dopants to form an N+ source/drain region 225, and then a silicon oxide layer 226 is formed over the whole structure.

Figure 3D:
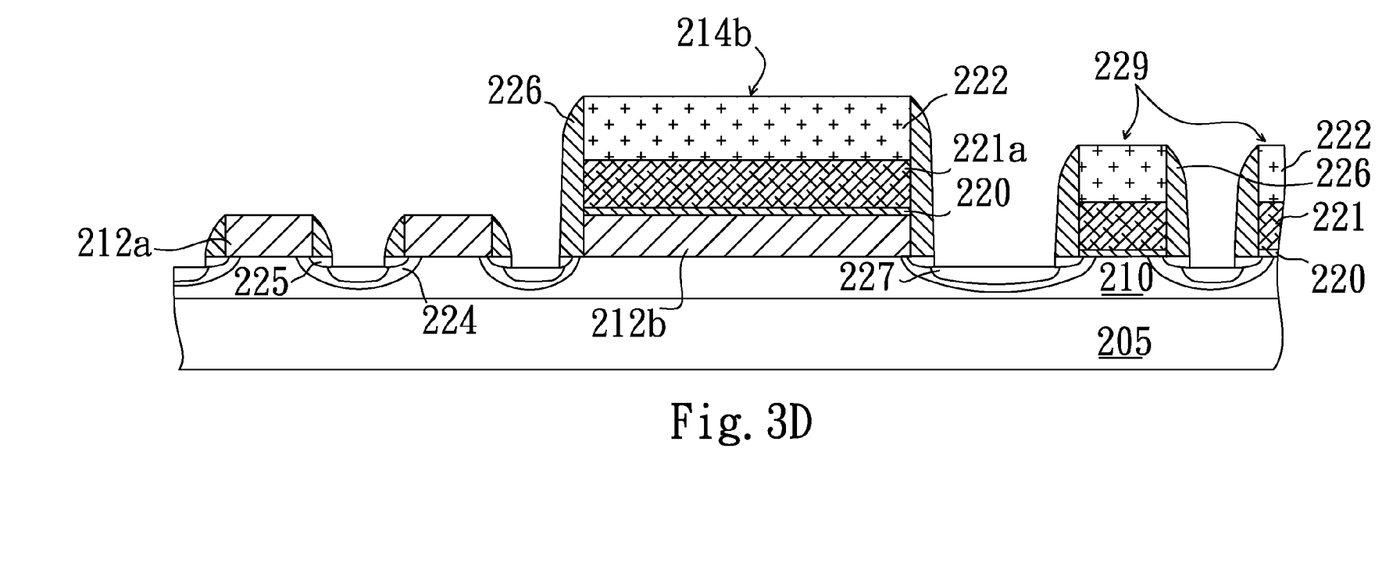

In FIG. 3D, the silicon oxide layer 226 and a portion of the N+ source region/drain region 225 are removed by dry etching until the P-well region 224 is exposed. Since the etching speed of the dry etching varies with etching directions, a portion of the silicon oxide layer 226 is remained on the sidewalls of the gate electrode 221b and the transmitting portion 221a, and the exposed surface of the remained silicon oxide layer are smooth. The ion implantation process is used again for implanting high concentration first dopants (which are P-type impurities in this embodiment) in the exposed P-well region 224 to form a P-type region 227. The thickness of the silicon oxide layer remained on the sidewalls of the gate electrode 221b and the transmitting portion 221a decides channel length of the N-type double-diffused metal oxide semiconductor (DMOS) cell, and the thickness of the remained silicon oxide layer depends on the thickness of the deposited silicon oxide layer 226. Therefore, the present invention can control the channel length of the N-type double-diffused metal oxide semiconductor (DMOS) cell by controlling the thickness of the silicon oxide layer 226.

Figure 3E:
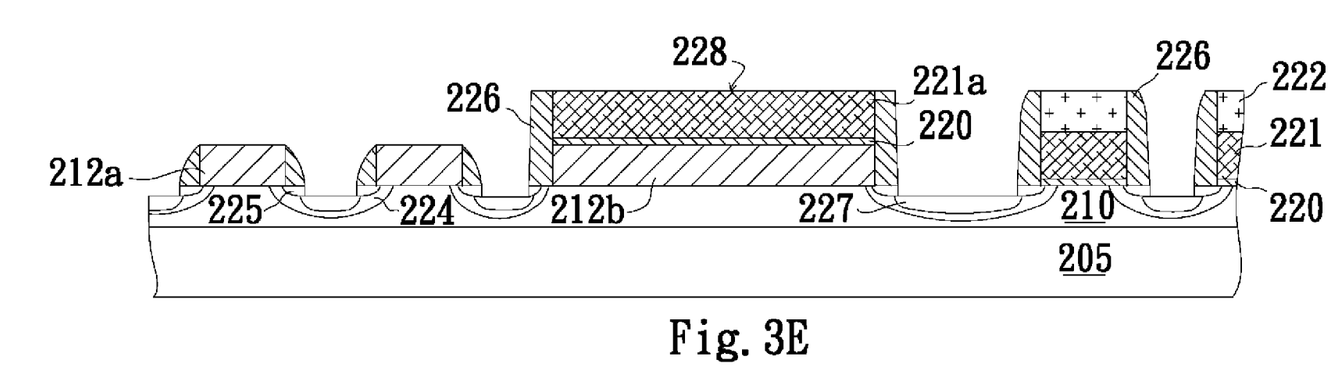

In FIG. 3E, chemical mechanical polishing (CMP) process is carried out for removing the dielectric layer 222 until the transmitting portion 221a is exposed. Since the surface profile corresponding to the transmitting portion 221a is higher than that corresponding to the gate electrode 221b, the portion of the dielectric layer 222 on the gate electrode 221b is remained to prevent the gate electrode 221b from being exposed. In the N-type double-diffused metal oxide semiconductor (DMOS) structure of the invention, the number of the contact windows 228 depends on the current required to be transmitted by the circuit or other considerations. In general, the number of the contact windows 228 is more than one.

Figure 3F:
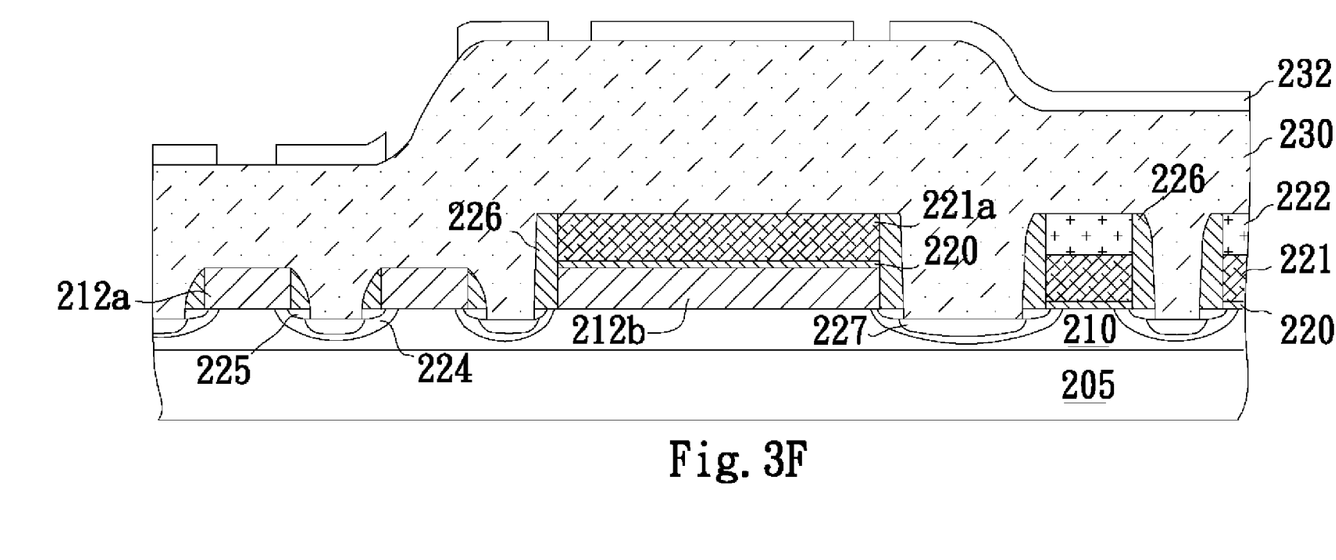
Figure 3G:
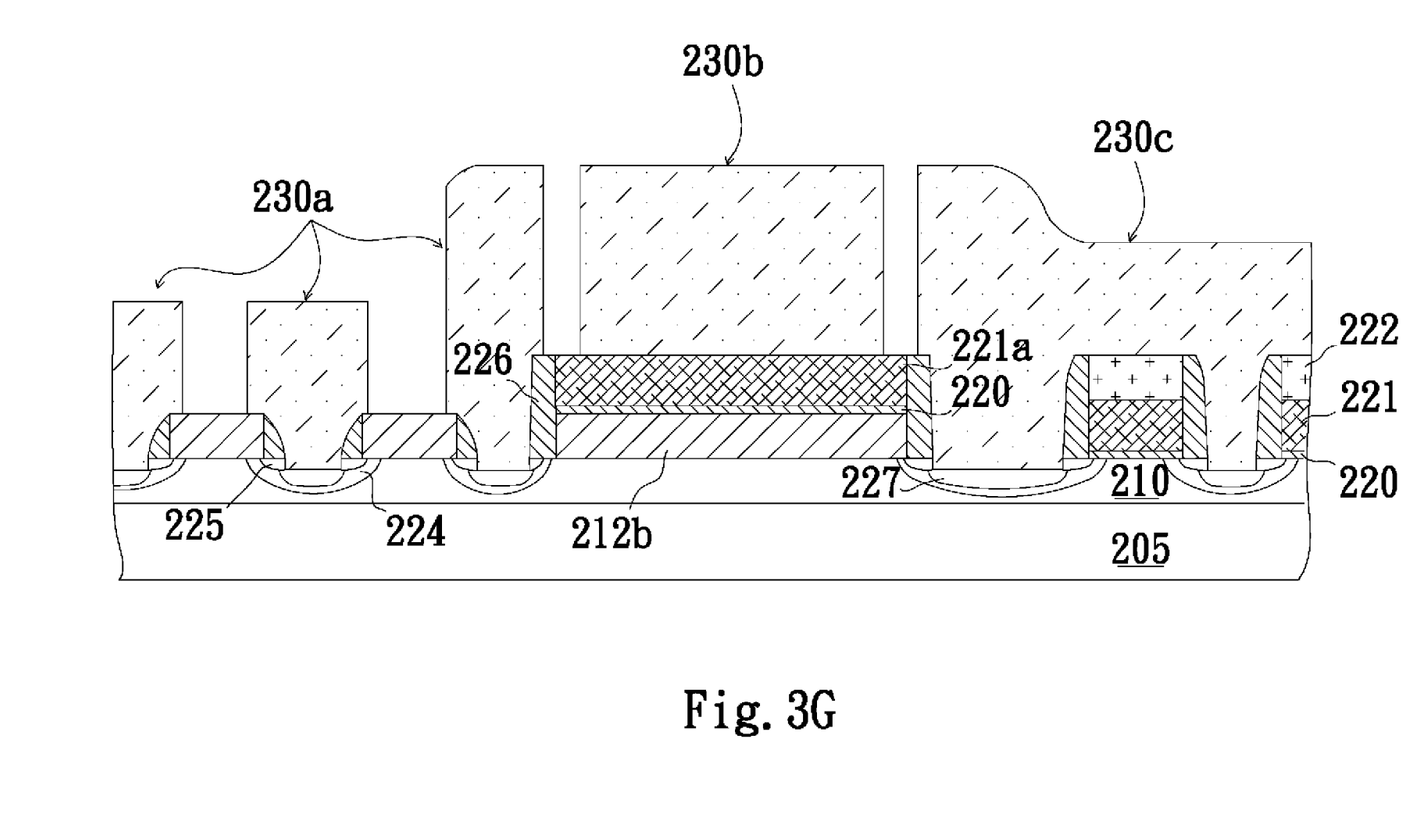

Afterward, in FIGS. 3F and 3G, a metal layer 230 is formed, and a third mask is used for forming a third photoresist layer 232 to define a source/drain pad 230c, a gate pad 230b, and a guard ring metal 230a in the metal layer 230.

In the aforementioned preferred embodiments, the N-type double-diffused metal oxide semiconductor (DMOS) structure is formed by using three masks only. Therefore, compared with prior art, which requires seven masks, the present invention substantially reduces the cost of masks.

In summation of the description above, the present invention overcomes the shortcomings of the prior art, and complies with the patent application requirements, and thus is duly filed for patent application. While the invention has been described by means of specific embodiments, numerous modifications and variations could be made thereto by those skilled in the art without departing from the scope and spirit of the invention set forth in the claims.

What is claimed is:

1. A semiconductor structure, comprising:
    a substrate, having an operating region and a transmitting region;
    a plurality of operating units, located in the operating region, for receiving a control signal, and operated according to the control signal;
    a non-conductive auxiliary structure, located in the transmitting region, having a plurality of spaces with a predetermined line-width being formed therein;
    a conductive layer, having a transmitting portion located in the spaces for electrically connecting to the operating units;
    a dielectric layer, located on the conductive layer, wherein a contact window is formed in the conductive layer and the dielectric layer to expose the auxiliary structure and the transmitting portion; and
    a contact portion, formed in the contact window for receiving the control signal, and connected to the transmitting portion.

2. The semiconductor structure of claim 1, wherein the contact window is formed by dry etching.

3. The semiconductor structure of claim 2, wherein the transmitting portion is made of polysilicon.

4. The semiconductor structure of claim 1, wherein the auxiliary structure and a field oxide layer pattern of a guard ring are defined simultaneously by using a mask.

5. A double-diffused metal oxide semiconductor (DMOS) structure, comprising:
    a substrate, having an operating region and a transmitting region;
    a plurality of DMOS cells, located in the operating region, each of the DMOS cells having a gate electrically coupled to the transmitting region, and operated according to a gate control signal;
    a non-conductive auxiliary structure, located in the transmitting region, having a plurality of spaces with a predetermined line-width being formed therein;
    a conductive layer, having a transmitting portion located in the spaces for electrically connecting to the DMOS cells;
    a dielectric layer, located on the conductive layer, wherein a contact window is formed in the conductive layer and the dielectric layer to expose the auxiliary structure and the transmitting portion; and
    a contact portion, formed in the contact window for receiving the gate control signal, and connected to the transmitting portion.

6. The double-diffused metal oxide semiconductor (DMOS) structure of claim 5, further comprising:
    at least one guard ring located at peripheries of the transmitting region and the transistor region, wherein the auxiliary structure and a field oxide layer pattern of the guard ring are defined simultaneously by using a mask.

7. The double-diffused metal oxide semiconductor (DMOS) structure of claim 6, wherein the transmitting portion is made of polysilicon.

8. The double-diffused metal oxide semiconductor (DMOS) structure of claim 6, wherein the contact window is formed by dry etching.

9. The double-diffused metal oxide semiconductor (DMOS) structure of claim 6, wherein the dielectric layer is a silicon nitride layer.

* * * * *